(12) United States Patent
Miyazaki et al.

(10) Patent No.: US 10,256,816 B2
(45) Date of Patent: Apr. 9, 2019

(54) MULTIDIRECTIONAL INPUT DEVICE

(71) Applicant: Panasonic Intellectual Property Management Co., Ltd., Osaka (JP)

(72) Inventors: Tatsuya Miyazaki, Osaka (JP); Yosuke Ohashi, Fukui (JP)

(73) Assignee: PANASONIC INTELLECTUAL PROPERTY MANAGEMENT CO., LTD., Osaka (JP)

(*) Notice: Subject to any disclaimer, the term of this patent is extended or adjusted under 35 U.S.C. 154(b) by 126 days.

(21) Appl. No.: 15/500,364

(22) PCT Filed: Sep. 2, 2015

(86) PCT No.: PCT/JP2015/004449
§ 371 (c)(1),
(2) Date: Jan. 30, 2017

(87) PCT Pub. No.: WO2016/035331
PCT Pub. Date: Mar. 10, 2016

(65) Prior Publication Data
US 2017/0222645 A1    Aug. 3, 2017

(30) Foreign Application Priority Data

Sep. 4, 2014  (JP) ................ 2014-179876
Oct. 14, 2014 (JP) ................ 2014-209577

(51) Int. Cl.
  *H01H 25/00*  (2006.01)
  *H03K 17/96*  (2006.01)
  (Continued)

(52) U.S. Cl.
  CPC .......... *H03K 17/9631* (2013.01); *G05G 1/02* (2013.01); *H01H 25/002* (2013.01); *H03H 9/175* (2013.01); *H03K 17/968* (2013.01)

(58) Field of Classification Search
  CPC ....... H01H 25/002; H01H 25/04; G01G 9/047
  See application file for complete search history.

(56) References Cited

U.S. PATENT DOCUMENTS

6,618,036 B1 * 9/2003 Tanaka ................. G05G 9/047
                                                  345/161

FOREIGN PATENT DOCUMENTS

| JP | 2002-260494 | 9/2002 |
| JP | 2008-146968 | 6/2008 |
| JP | 2009-266734 | 11/2009 |

OTHER PUBLICATIONS

International Search Report of PCT application No. PCT/JP2015/004449 dated Nov. 24, 2015.

* cited by examiner

*Primary Examiner* — Thanh Luu
(74) *Attorney, Agent, or Firm* — Greenblum & Bernstein, P.L.C.

(57) ABSTRACT

A multidirectional input device includes a case, and a movable body that is restrained from rotating relative to the case, disposed so as to face the case, and mounted on the case so as to be movable in directions with a predetermined neutral position as a base point. The multidirectional input device further includes a first position detector that outputs a first signal in response to a position of the movable body, and a cam part formed on one of a surface, facing the case, of the movable body, and a surface, facing the movable body, of the case. The multidirectional input device further includes a restraint member having a tip which is in elastic contact with the cam part to urge the movable body to the neutral position, and a second position detector that outputs a second signal in response to a position of the restraint member.

4 Claims, 4 Drawing Sheets

(51) Int. Cl.
*G05G 1/02* (2006.01)
*H03H 9/17* (2006.01)
*H03K 17/968* (2006.01)

MULTIDIRECTIONAL INPUT DEVICE

This application is a U.S. national stage application of the PCT International Application No. PCT/JP2015/004449 filed on Sep. 2, 2015, which claims the benefit of foreign priority of Japanese patent application 2014-179876 filed on Sep. 4, 2014 and Japanese patent application 2014-209577 filed on Oct. 14, 2014 the contents all of which are incorporated herein by reference.

TECHNICAL FIELD

The present technology relates to a multidirectional input device used for operation of an electronic device. The present technology mainly relates to a multidirectional input device used for operation of various electronic devices in a motor vehicle.

BACKGROUND ART

In recent years, multidirectional input devices enabling various operation such as rotary operation, pressing operation, and sliding operation are provided in an instrument panel, a console box, or the like in a vehicle interior. Multidirectional input devices enabling operation of various electronic devices such as a car navigation device, an audio device, and an air conditioner in vehicle interior are increasing. Furthermore, multidirectional input devices enabling operation of headlights, windshield wipers, direction indicators of vehicles are also increasing.

A multidirectional input device having various functions and enabling more reliable operation is required.

As conventional multidirectional input devices, for example, PTL 1 and PTL 2 are known.

CITATION LIST

Patent Literatures

PTL 1: Unexamined Japanese Patent Publication No. 2008-146968
PTL 2: Unexamined Japanese Patent Publication No. 2009-266734

SUMMARY OF THE INVENTION

A multidirectional input device of the present disclosure includes a case; a movable body that is restrained from rotating relative to the case, disposed so as to face the case, and mounted on the case so as to be movable in a plurality of directions with a predetermined neutral position as a base point; a first position detector that outputs a first signal in response to a position of the movable body; a cam part formed on one of a surface, facing the case, of the movable body, and a surface, facing the movable body, of the case; and a restraint member having a tip which is in elastic contact with the cam part to urge the movable body to the neutral position; and a second position detector that outputs a second signal in response to a position of the restraint member.

DESCRIPTION OF EMBODIMENT

Prior to description of an exemplary embodiment, a problem of conventional multidirectional input devices noticed by inventor(s) is described.

In the conventional multidirectional input devices, in a case where ambient temperature change or voltage variation of a power supply is caused during use, a voltage signal output from a light receiving/emitting element varies in response to reflected light from a reflection part. For example, it is assumed that a voltage signal of 3 V is set to be output in a state where the multidirectional input device is located at a neutral position. However, in the case where ambient temperature change or voltage variation of a power supply is caused during use, a voltage signal of 1.5 V is output although an operation body and a movable body are each located at a neutral position. In this case, although the operation body and the movable body are each located at the neutral position, for example, a controller erroneously detects that sliding operation in a right direction is performed.

As described above, the conventional multidirectional input devices have a problem that a voltage value of an output signal varies depending on a surrounding environment or the like, the controller performs erroneous detection, and malfunction is caused.

Hereinafter, an exemplary embodiment is described with reference to FIG. 1 to FIG. 3.

Exemplary Embodiment

Figure 1:
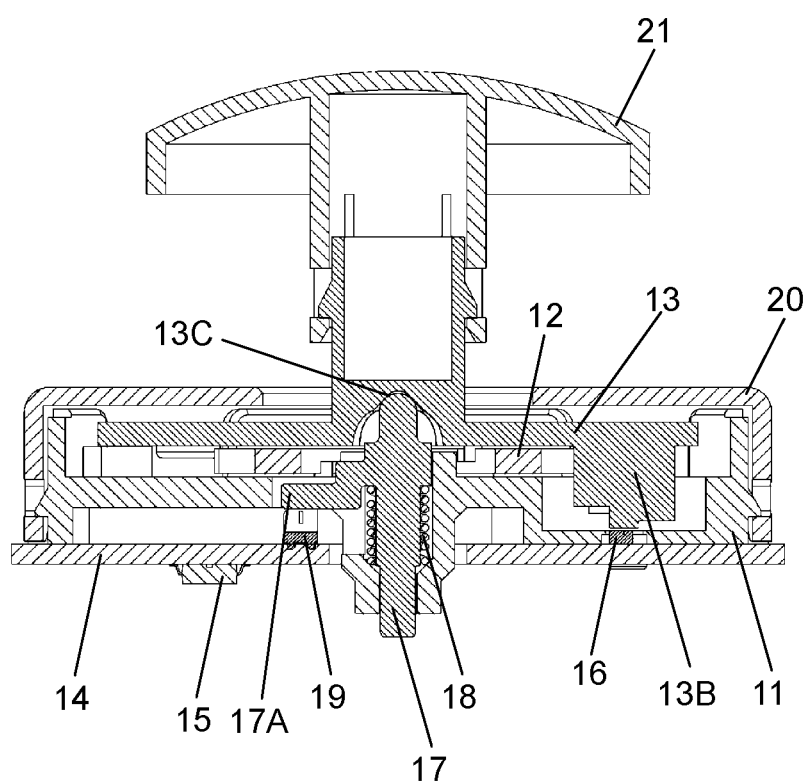
FIG. 1 is a sectional view of a multidirectional input device according to an exemplary embodiment.

FIG. 1 is a sectional view of a multidirectional input device of an exemplary embodiment. FIG. 2 is an exploded perspective view of the multidirectional input device of the exemplary embodiment.

[Configuration of Multidirectional Input Device]

First, a configuration of the multidirectional input device of the exemplary embodiment is described.

Case 11 is made of insulation resin such as polycarbonate (hereinafter, described as PC), an acrylonitrile-butadiene-styrene copolymer (hereinafter, described as ABS), polybutylene terephthalate (hereinafter, described as PBT), polyoxymethylene (hereinafter, described as POM), and is formed in a substantially disk shape. Slider 12 is made of insulation resin such as POM and PBT. Wall parts 11A formed on an upper surface of case 11 are inserted into grooves 12A provided in a right-left direction on a lower surface of slider 12. Slider 12 is mounted on the upper surface of case 11 so as to be slidable in the right-left direction.

Further, movable body 13 is made of insulation resin such as PBT and POM, and wall parts 13A are provided in a front-rear direction on a lower surface of movable body 13. Wall parts 13A are inserted into grooves 12B formed on an upper surface of slider 12, and movable body 13 is mounted on the upper surface of slider 12 so as to be slidable in the front-rear direction.

Figure 2:
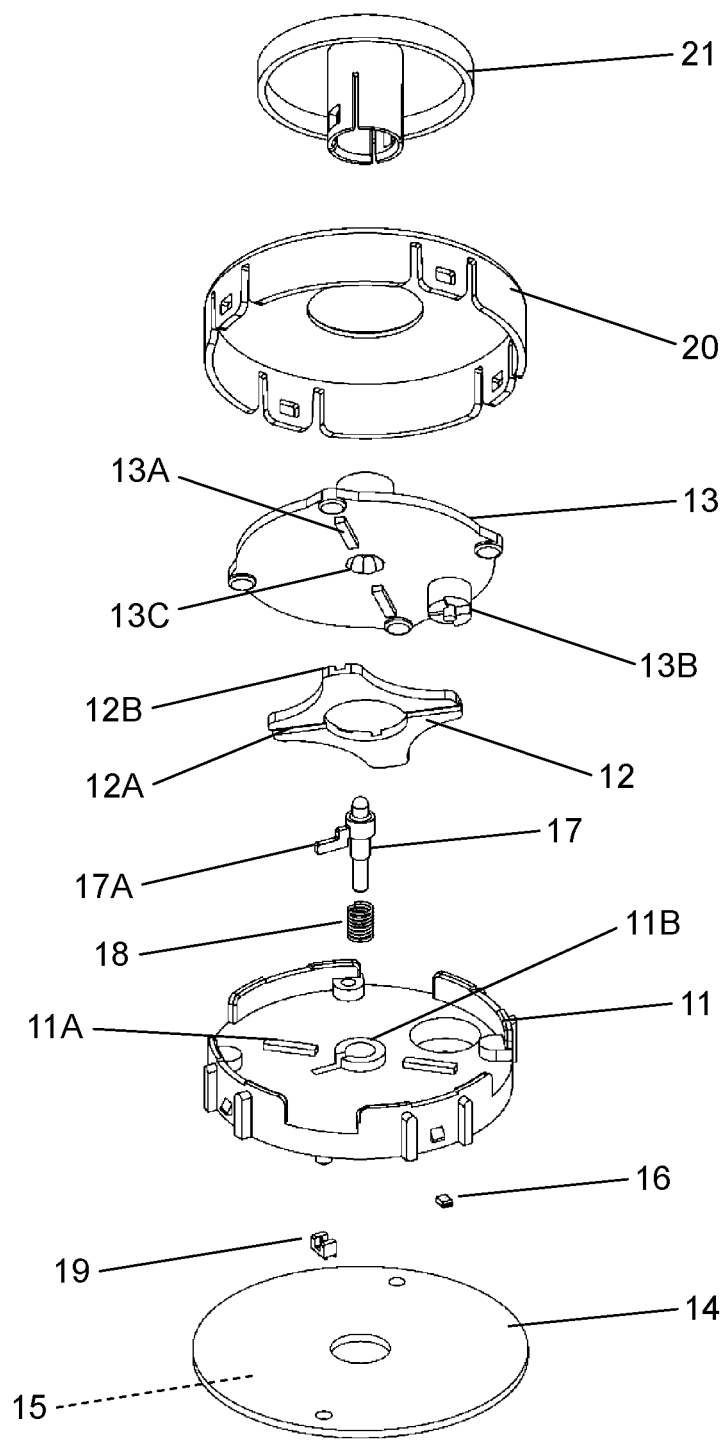
FIG. 2 is an exploded perspective view of the multidirectional input device according to the exemplary embodiment.
Figure 3:
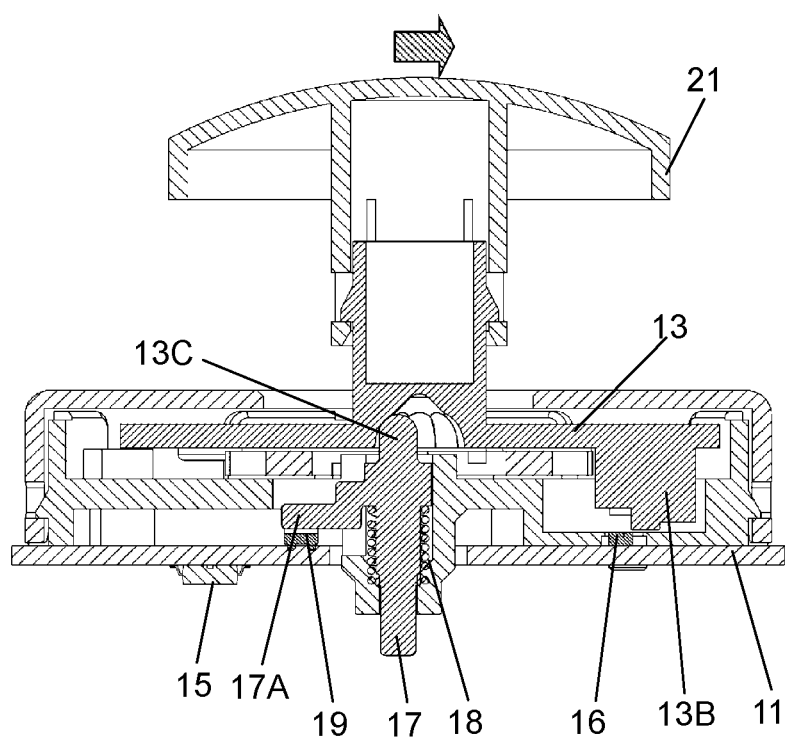
FIG. 3 is a sectional view in operation of the multidirectional input device according to the exemplary embodiment.

As illustrated in FIG. 1 to FIG. 3, slider 12 is mounted on the upper surface of case 11 so as to be slidable in the right-left direction. Furthermore, movable body 13 is mounted on the upper surface of slider 12 so as to be slidable in the front-rear direction orthogonal to the right-left direction. Accordingly, movable body 13 is mounted so as to be movable in the right-left direction, in the front-rear direction, and in a plurality of directions between the right-left direction and the front-rear direction, in a state where movable body 13 is restrained from rotating relative to case 11 via slider 12. That is, movable body 13 is mounted on case 11 via slider 12 so as to be movable in any direction.

Wiring board 14 is formed of paper phenol, epoxy containing glass, or the like. Additionally, on upper and lower surfaces of wiring board 14, a plurality of wiring patterns (not illustrated) are formed by copper foil and the like. Furthermore, a microcomputer and the like (not illustrated) are mounted on the lower surface of wiring board 14, and controller 15 is provided. Light receiving/emitting element 16 is provided on the upper surface of wiring board 14. On the lower surface of movable body 13, reflection part 13B formed from a plurality of substantially stepped planar parts is provided. Light receiving/emitting element 16 is formed from a light emitting diode, a phototransistor, or the like. Light receiving/emitting element 16 is disposed so as to face reflection part 13B at a predetermined gap. A position detector is configured of light receiving/emitting element 16 and reflection part 13B.

Furthermore, restraint member 17 is made of insulation resin such as PBT and POM, and is formed in a pin shape. Spring 18 is made of a piano wire, a stainless steel wire, or a copper alloy wire, and is spirally wound. Spring 18 is housed in guide part 11B located at a central part of case 11 in a slightly warped state. An upper end of restraint member 17 urged by spring 18 is in elastic contact with a central part of cam part 13C on the lower surface of movable body 13, and movable body 13 is urged to a neutral position.

Next, a position detector different from the position detector configured of light receiving/emitting element 16 and reflection part 13B is described. A position detector configured of light receiving/emitting element 19 and arm part 17A is a position detector provided in order to detect a neutral position, and is hereinafter referred to as a "neutral position detector". In restraint member 17, arm part 17A is provided. Arm part 17A extends laterally from restraint member 17.

On the upper surface of wiring board 14, light receiving/emitting element 19 is provided. Light receiving/emitting element 19 is disposed so as to face arm part 17A. Light receiving/emitting element 19 is formed by, for example, a photo-interrupter including a light emitting diode, a phototransistor, or the like. As described above, the position detector (neutral position detector) is configured of light receiving/emitting element 19 and arm part 17A.

Cover 20 and operation body 21 are each made of insulation resin such as polycarbonate resin (PC) and ABS (acrylonitrile-butadiene-styrene) resin. Cover 20 is fixed to the upper surface of case 11 to cover slider 12, movable body 13, and the like. Further, operation body 21 is fixed to an upper end of a cylindrical shaft of movable body 13, protruding from an opening hole in an upper surface of cover 20. As described above, the multidirectional input device of the exemplary embodiment is configured.

The multidirectional input device of the exemplary embodiment is mounted on, for example, a console box provided on a lateral side of a driver's seat in a motor vehicle, while operation body 21 protrudes upward.

Furthermore, controller 15, light receiving/emitting elements 16, 19, and the like are electrically connected to an electronic circuit (not illustrated) of the motor vehicle via a connector, a lead wire (not illustrated), or the like. Details of controller 15 are described below.

[Normal Operation of Multidirectional Input Device]

(Operation at Neutral Position)

First, operation of the multidirectional input device in a state where operation body 21 is not operated, the upper end of restraint member 17 is in elastic contact with the central part of cam part 13C, and movable body 13 is located at a neutral position is described.

Light receiving/emitting element 19 has a U-shape. A light receiving part is disposed in one of wall parts of light receiving/emitting element 19, and a light emitting part is disposed in the other wall part. That is, the light emitting part and the light receiving part are disposed so as to face each other. Therefore, in light receiving/emitting element 19, light is directly incident upon the light receiving part from the light emitting part.

When movable body 13 is located at the neutral position, arm part 17A is located above light receiving/emitting element 19. Accordingly, arm part 17A which becomes a shield is not interposed between the light emitting part and the light receiving part of light receiving/emitting element 19. Therefore, at this time, light is incident upon the light receiving part from the light emitting part.

In the above state, for example, a voltage signal of 5 V is output from light receiving/emitting element 19. By this voltage signal from light receiving/emitting element 19, controller 15 detects that movable body 13 is located at the neutral position.

At this time, among the plurality of planar parts of reflection part 13B disposed on the lower surface of movable body 13, a planar part at a lowermost end in the central part faces light receiving/emitting element 16. That is, a gap between reflection part 13B and light receiving/emitting element 16 is the narrowest.

Then, a voltage is applied to light receiving/emitting element 16 from controller 15, light receiving/emitting element 16 emits light, this light is reflected on the planar part at the lowermost end of reflection part 13B, and light receiving/emitting element 16 receives reflected light. At this time, the gap between reflection part 13B and light receiving/emitting element 16 is the narrowest, and therefore the reflected light becomes strong light. A voltage in response to this strong reflected light (for example, a voltage signal of 3 V in a case of a normal ambient temperature or a normal voltage state) is output to controller 15 from light receiving/emitting element 16. Controller 15 determines that the voltage signal is the same as a reference voltage of 3 V.

Note that, power consumption becomes somewhat large, but light receiving/emitting element 16 may be made to always emit light.

(Sliding Operation in Right Direction)

Next, operation when operation body 21 slides in the right direction is described with reference to FIG. 3. FIG. 3 is a sectional view in operation of the multidirectional input device of the exemplary embodiment.

Operation body 21 is moved in a predetermined direction by a hand or the like in a state where a plurality of menus and the like are displayed on a liquid crystal display panel (not illustrated) of a car navigation or the like in front of the driver's seat. For example, as illustrated in FIG. 3, when operation body 21 slides in the right direction, movable body 13 moves on the upper surface of case 11 in the right direction since operation body 21 is fixed to the upper end of the cylindrical shaft of movable body 13.

At this time, movable body 13 is moved in the right direction, so that a state is changed such that the upper end of restraint member 17 comes into elastic contact with a left side from the central part of cam part 13C. Restraint member 17 moves downward, and arm part 17A moves into a space between the light emitting part and the light receiving part of light receiving/emitting element 19. At this time, arm part 17A blocks light to be incident upon the light receiving part from the light emitting part. Accordingly, the light from light emitting part is not incident upon the light receiving part. In a state where the light from light emitting part is not incident upon the light receiving part, for example, a voltage signal of 0 V is output from light receiving/emitting element 19. By the voltage signal of 0 V, controller 15 detects that movable body 13 is not located at the neutral position.

With the movement of movable body 13 in the right direction, reflection part 13B also moves in the right direction. At this time, in light receiving/emitting element 16, a planar part having a slightly large gap between reflection part 13B and light receiving/emitting element 16 faces light receiving/emitting element 16. At this time, light receiving/emitting element 16 and reflection part are slightly spaced apart from each other, and therefore reflected light received by light receiving/emitting element 16 is slightly weak. A voltage (for example, a voltage signal of 1.5 V) in response to this slightly weak reflected light is output as a position signal from light receiving/emitting element 16 to controller 15.

Then, the input voltage signal 1.5 V falls within a preset threshold value (which is, for example, a reference value of 1.5 V and within a range from 1.25 V to 1.75 V) for right direction determination, and therefore controller 15 detects that operation body 21 and movable body 13 slide in the right direction.

(Sliding Operation in Left Direction and Front-Rear Direction)

Next, a case where operation body 21 slides in a left direction is described. Operation when operation body 21 slides right, and operation when operation body 21 slides left are similar, and a state where operation body 21 slides left is not illustrated.

When movable body 13 slides on the upper surface of case 11 in the left direction, restraint member 17 moves downward, and the neutral position detector detects that movable body 13 is not located at the neutral position.

At the same time, reflection part 13B also moves in the left direction, another planar part faces light receiving/emitting element 16, and for example, a voltage signal of 2.5 V is output from light receiving/emitting element 16.

The voltage signal of 2.5 V falls within a preset threshold value (which is, for example, a reference value of 2.5 V and within a range from 2.25 V to 2.75 V) for left direction determination, and therefore controller 15 detects that operation body 21 and movable body 13 slide in the left direction.

In a case where operation body 21 slides in the front-rear direction, reflection part 13B similarly moves in the front-rear direction, and restraint member 17 moves downward, so that the neutral position detector detects that movable body 13 is not located at the neutral position.

With the movement of reflection part 13B in the front or rear direction, for example, light receiving/emitting element 16 outputs a voltage signal of 1.0 V in a case of the movement in the front direction, and outputs a voltage signal of 2.0 V in a case of the movement in the rear direction. These voltage signals each fall within a preset threshold value which is, for example, a reference value of 1.0 V and within a range from 0.75 V to 1.25 V, in the case of the movement in the front direction, and each fall within a preset threshold value which is, for example, a reference value of 2.0 V and within a range from 1.75 V to 2.25 V, in the case of the movement in the rear direction, and therefore controller 15 detects that movable body 13 slides in the front direction or in the rear direction.

Light receiving/emitting element 16 outputs different voltage signals depending on a moving direction. By the voltage signal input from light receiving/emitting element 16, controller 15 detects which direction operation body 21 and movable body 13 move. A cursor, a pointer or the like displayed on the liquid crystal display panel via the electronic circuit of the vehicle is moved in an operated direction, and a desired menu is selected from the plurality of menus.

Further, at this time, the upper end of restraint member 17 urged by spring 18 moves downward to come into elastic contact with a left or right side, or a rear or front side, or the like from the central part of cam part 13C on the lower surface of movable body 13 in response to the moving operation of operation body 21, while spring 18 is warped. Moving operation of operation body 21 in each direction is performed with an excellent operation feeling accompanied with a restraint feeling by the above operation.

Furthermore, after moving operation in a direction different from the neutral position of operation body 21 is performed, when the hand is separated from operation body 21, restraint member 17 moves upward by elastic return force of spring 18. Then, restraint member 17 comes into elastic contact with the central part from the left or right side of cam part 13C. Consequently, operation body 21 or movable body 13 returns to the neutral position.

That is, operation body 21 of the multidirectional input device, mounted on the console box or the like of his/her hand of a driver, is moved in the right-left direction, the front-rear direction, or various directions between the right-left direction and the front-rear direction, so that the plurality of menus displayed on the liquid crystal display panel is selected. By the multidirectional input device, various operation of a device in the vehicle can be performed.

[Operation after Voltage Variation of Multidirectional Input Device]

Next, operation of the multidirectional input device in a case where ambient temperature change, voltage variation of a power supply, or the like is caused is described.

When operation body 21 and movable body 13 are each at the neutral position, controller 15 detects that movable body 13 is located at the neutral position, by a voltage signal from light receiving/emitting element 19. Additionally, a voltage signal from light receiving/emitting element 16 is input to controller 15.

For example, it is assumed that a voltage signal output from controller 15 lowers to 1.5 V due to some sort of causes. A normal reference voltage at the neutral position is assumed to be 3 V. When controller 15 detects that the reference voltage is 1.5 V which is varied, it is determined that a rate of change to the reference voltage is ½.

Then, controller 15 reflects the rate of change of ½ to the threshold value of the voltage signal, by which it is determined that movable body 13 is located in the right direction. As a result, the preset reference value which is the threshold value for right direction determination is corrected from 1.5 V to 0.75 V. Furthermore, the range of the right direction determination is corrected from 1.25 V to 1.75 V, to 0.625 V to 0.875 V.

Similarly, controller 15 reflects the rate of change of ½ to the threshold value of the voltage signal, by which it is determined that movable body 13 is located in the left direction. As a result, the preset reference value which is the threshold value for left direction determination is corrected from 2.5 V to 1.25 V. Furthermore, the range of the left direction determination is corrected from 2.25 V to 2.75 V, to 1.125 V to 1.375 V.

Similarly, controller 15 reflects the rate of change of ½ to the threshold value of the voltage signal, by which it is determined that movable body 13 is located in the front direction. As a result, the preset reference value which is the threshold value for front direction determination is corrected from 1.0 V to 0.5 V. Furthermore, the range of the front direction determination is corrected from 0.75 V to 1.25 V, to 0.375 V to 0.625 V.

Similarly, controller 15 reflects the rate of change of ½ to the threshold value of the voltage signal, by which it is determined that movable body 13 is located in the rear direction. As a result, the preset reference value which is the threshold value for rear direction determination is corrected from 2.0 V to 1.0 V. Furthermore, the range of the rear direction determination is corrected from 1.75 V to 2.25 V, to 0.875 V to 1.125 V.

That is, the multidirectional input device of the exemplary embodiment can correct the reference value, in a case where the voltage signal output from light receiving/emitting element 16 varies depending on ambient temperature change, voltage variation of a power supply or the like. By the voltage signal output from light receiving/emitting element 19, controller 15 detects that movable body 13 is located at the neutral position, and identifies that there is a deviation from the normal reference value (for example, 3 V) at the same time. Each threshold value (reference value and range) used when the neutral position and each operating direction are determined is corrected based on the rate of change in a voltage after variation to the normal reference value. Accordingly, even when the voltage signal from light receiving/emitting element 16 varies, erroneous detection is unlikely to be caused in determination of the operating direction of movable body 13.

Note that, in the above description, controller 15 corrects the threshold value used when the operating direction is determined, in proportion to the rate of change in a voltage signal at the neutral position. However, the threshold value may be corrected by a predetermined correction ratio other than proportion of variation in a voltage signal in response to a property of light receiving/emitting element 16 or a circuit component. That is, a method for correction is not limited to a method for correction of multidirectional input device of the exemplary embodiment.

In a state where operation body 21 is not operated, namely, in a state where movable body 13 is held at the neutral position and is stationary, controller 15 conducts a voltage to light receiving/emitting element 19 intermittently once per predetermined time (for example, two minutes), in order to suppress power consumption. When a voltage is conducted to light receiving/emitting element 19, the neutral position of movable body 13 is detected, and the voltage signal from light receiving/emitting element 16 is detected at the same time. Then, the voltage signal detected from light receiving/emitting element 16 is compared with the normal reference voltage, and the threshold value in each moving direction is corrected in response to the variation of the voltage signal at the neutral position.

Thus, the multidirectional input device of the exemplary embodiment includes the position detector for detecting the moving direction of movable body 13 in a plurality of directions with a predetermined neutral position as a reference. Furthermore, the multidirectional input device includes the position detector (neutral position detector) formed from arm part 17A extending to a lateral side of restraint member 17, and light receiving/emitting element 19 disposed so as to face arm part 17A. The neutral position detector can detect whether movable body 13 is located at the neutral position, by a vertical position of restraint member 17.

With the above configuration, even in a case where the position signal (voltage signal) output from light receiving/emitting element 16 varies depending on ambient temperature change, voltage variation of a power supply, or the like, the neutral position detector can reliably detect the neutral position of movable body 13. When movable body 13 is located at the neutral position, each threshold value used when each operating direction is determined, can be corrected in response to change in the voltage signal output from light receiving/emitting element 16.

The multidirectional input device of the exemplary embodiment includes case 11, and movable body 13 that is restrained from rotating relative to case 11, disposed so as to face case 11, and mounted on case 11 so as to be movable in the plurality of directions with the predetermined neutral position as a base point. Further, the multidirectional input device includes a first position detector (position detector) that outputs a first signal in response to a position of movable body 13. Furthermore, the multidirectional input device includes cam part 13C formed on one of a surface, facing case 11, of movable body 13, and a surface, facing movable body 13, of case 11. Furthermore, the multidirectional input device includes restraint member 17 having a tip which is in elastic contact with cam part 13C to urge movable body 13 to the predetermined position (neutral position). Furthermore, the multidirectional input device includes a second position detector (neutral position detector) that outputs a second signal in response to a position of restraint member 17.

Accordingly, the multidirectional input device of this exemplary embodiment has reduced erroneous detection of the operating direction, and can more reliably detect the operating direction.

More preferably, the second position detector (neutral position detector) has arm part 17A connected to restraint member 17. The second position detector (neutral position detector) outputs the second signal in response to a position of arm part 17A.

In the above configuration, the neutral position detector can detect the neutral position by vertical movement of arm part 17A. Accordingly, light receiving/emitting element 19 (or other detection body) can be disposed at a position away from restraint member 17. Additionally, movement of arm part 17A is easily and reliably detected.

More preferably, the multidirectional input device of this exemplary embodiment further includes controller 15 that detects whether the movable body is located at the neutral position, by the second signal output from the second position detector (neutral position detector).

In the multidirectional input device of this exemplary embodiment, light receiving/emitting element 19 is used as a detection body of the neutral position detector. Light receiving/emitting element 19 is a light receiving/emitting element in which the light emitting part and the light receiving part are disposed so as to face each other, and therefore it can be detected whether movable body 13 is located at the neutral position, by vertical movement of arm part 17A accompanied with vertical movement of restraint member 17.

In the multidirectional input device of this exemplary embodiment, the neutral position detector has light receiving/emitting element 19, and the neutral position is detected by output from light receiving/emitting element 19. However, the neutral position detector does not always have to have light receiving/emitting element 19. For example, in place of light receiving/emitting element 19, a magnet may be fixed to arm part 17A of restraint member 17, and a magnetism detection element such as a hall element may be disposed at a position facing arm part 17A. Whether the movable body is located at the neutral position may be detected by output from the magnetism detection element accompanied by vertical movement of arm part 17A.

Although reliability of detection is somewhat degraded, a push switch or a lever switch is disposed below arm part 17A, and the neutral position is detected by turning on/off of the above switch with vertical movement of arm part 17A accompanied with vertical movement of restraint member 17, so that the present invention can be implemented.

That is, as long as the neutral position detector can detect the neutral position, the neutral position detector is not limited to the configuration of this exemplary embodiment.

In the above description, light receiving/emitting element 19 is disposed on the upper surface of wiring board 14, and arm part 17A of restraint member 17 vertically moves relative to light receiving/emitting element 19 between movable body 13 and case 11. However, the present invention is not limited to this configuration. For example, arm part 17A may be provided in a lower end of restraint member 17 protruding downward from guide part 11B of case 11, and light receiving/emitting element 19 may be disposed on the lower surface of wiring board 14 so as to face arm part 17A. Also in this configuration, arm part 17A vertically moves relative to light receiving/emitting element 19 with vertical movement of restraint member 17, and therefore the present invention can be implemented.

Figure 4:
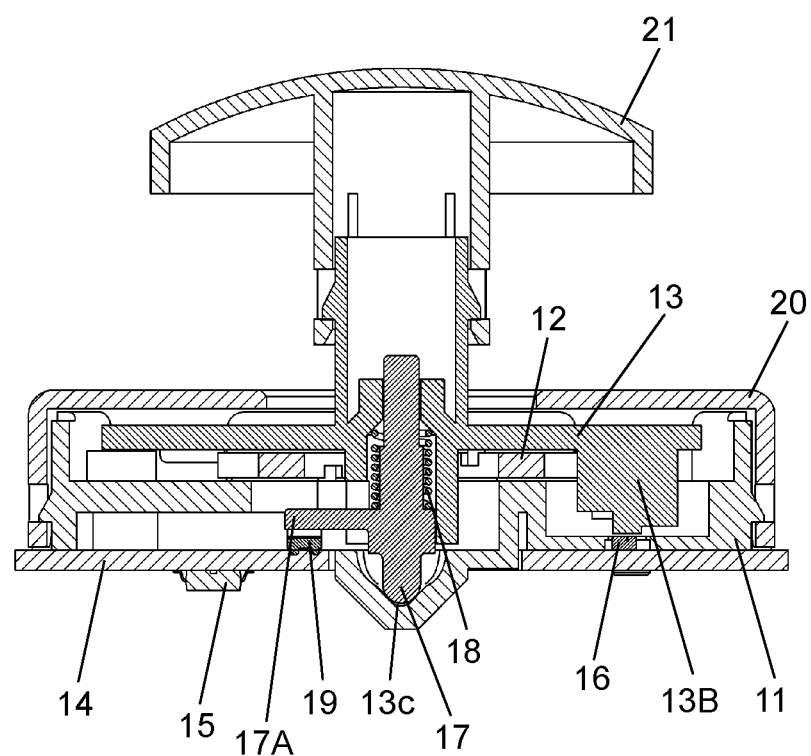
FIG. 4 is a sectional view of a multidirectional input device according to a modification of the exemplary embodiment.

In the multidirectional input device of this exemplary embodiment, cam part 13C is provided on the lower surface of movable body 13. Additionally, spring 18 and restraint member 17 are housed in guide part 11B of case 11, and the upper end of restraint member 17 is in elastic contact with cam part 13C. However, as illustrated in FIG. 4, cam part 13C may be provided on the upper surface of case 11, spring 18 and restraint member 17 may be housed in the lower surface of movable body 13, and a lower end of restraint member 17 may be in elastic contact with cam part 13C. Note that, in FIG. 4, configurations similar to the configurations of the multidirectional input device illustrated in FIG. 1 are denoted by the same reference numerals, and description thereof is omitted.

In the multidirectional input device illustrated in FIG. 1, at the neutral position, light receiving/emitting element 19 is spaced apart from arm part 17A. When the position is shifted from the neutral position, light receiving/emitting element 19 gets close to arm part 17A. On the other hand, in a modification of a multidirectional input device illustrated in FIG. 4, at the neutral position, light receiving/emitting element 19 is close to arm part 17A.

When the position is shifted from the neutral position, light receiving/emitting element 19 is spaced apart from arm part 17A.

Furthermore, in this exemplary embodiment, light receiving/emitting element 19 in which a light emitting element (light emitting part) is integrated with a light receiving element (light receiving part) is used. However, the light emitting element (light emitting part) and the light receiving element (light receiving part) may be separately configured.

In this exemplary embodiment, the multidirectional input device includes controller 15. However, the multidirectional input device does not always have to have the controller. The controller may be provided in an in-vehicle electronic circuit or an in-vehicle electronic device connected to the multidirectional input device. Even when controller 15 is not provided in the multidirectional input device, it is possible to detect the neutral position of movable body 13, or detect the operating direction.

Note that, in the multidirectional input device of this exemplary embodiment, arm part 17A extends from restraint member 17. However, arm part 17A does not always have to extend from restraint member 17. Arm part 17A may be integrally formed with restraint member 17, and may not extend from restraint member 17.

In the multidirectional input device of this exemplary embodiment, light receiving/emitting element 19 including the light emitting part and the light receiving part disposed so as to face each other is used in the neutral position detector. However, as light receiving/emitting element 16, a light receiving/emitting element including a light emitting part and a light receiving part disposed adjacent to each other may be used. Note that, in a case where the light receiving/emitting element including the light emitting part and the light receiving part disposed adjacent to each other is used, arm part 17A functions as a reflection part.

That is, in the multidirectional input device of this exemplary embodiment, the neutral position detector may have a light emitting part and a light receiving part, and arm part 17A may block incidence of light upon the light receiving part with movement of restraint member 17, the light being output from the light emitting part. As a configuration of another neutral position detector, the neutral position detector may have a light emitting part and a light receiving part, and arm part 17A may reflect light output from the light emitting part with movement of restraint member 17, and the reflected light may be incident upon the light receiving part.

INDUSTRIAL APPLICABILITY

The multidirectional input device according to the present disclosure can prevent erroneous detection of an operating direction with a simple configuration, and implement reliable operation. The multidirectional input device according to the present disclosure is useful for operation of various electronic devices of a motor vehicle.

REFERENCE MARKS IN THE DRAWINGS 11 case
11A, 13A wall part
11B guide part
12 slider
12A, 12B groove
13 movable body
13B reflection part
13C cam part
14 wiring board
15 controller
16, 19 light receiving/emitting element
17 restraint member
17A arm part
18 spring
20 cover
21 operation body

The invention claimed is:

1. A multidirectional input device comprising:
   a case;
   a movable support that is restrained from rotating relative to the case, disposed so as to face the case, and mounted on the case so as to be movable in a plurality of directions with a predetermined neutral position as a base point;
   a first position detector that outputs a first signal in response to a position of the movable support;
   a cam formed on one of a surface, facing the case, of the movable support, and a surface, facing the movable support, of the case;
   a restraint having a tip which is in elastic contact with the cam to urge the movable support to the neutral position;
   a second position detector that outputs a second signal in response to a position of the restraint; and
   a controller that detects whether the movable support is located at the neutral position, by the second signal.

2. The multidirectional input device according to claim 1, wherein
   the second position detector has an arm connected to the restraint, and
   the second position detector outputs the second signal in response to a position of the arm.

3. The multidirectional input device according to claim 2, wherein
   the second position detector further has a light emitter and a light receiver, and
   the arm blocks incidence of light upon the light receiver with movement of the restraint, the light being output from the light emitter.

4. The multidirectional input device according to claim 2, wherein
   the second position detector further has a light emitter and a light receiver, and
   the arm reflects light output from the light emitter with movement of the restraint, and the reflected light is incident upon the light receiver.

* * * * *